(12) United States Patent
Mett et al.

(10) Patent No.: US 6,500,299 B1
(45) Date of Patent: Dec. 31, 2002

(54) CHAMBER HAVING IMPROVED GAS FEED-THROUGH AND METHOD

(75) Inventors: Richard R. Mett, Whitefish Bay, WI (US); Hamid Noorbakhsh, Fremont; Robert D. Greenway, Sunnyvale, both of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/360,351

(22) Filed: Jul. 22, 1999

(51) Int. Cl.[7] .............................................. H05H 1/00
(52) U.S. Cl. ............... 156/345; 118/723 R; 118/723 E; 118/728
(58) Field of Search .................... 156/345; 261/67; 118/723 VE, 723 R, 723 E, 728

(56) References Cited

U.S. PATENT DOCUMENTS

| 4,412,133 A | 10/1983 | Eckes et al. ............. 250/492.2 |
| 4,608,493 A | 8/1986 | Hayafuji .................... 250/397 |
| 5,055,964 A | 10/1991 | Logan et al. ................ 361/234 |
| 5,151,845 A | 9/1992 | Watanabe et al. ........... 361/234 |
| 5,191,506 A | 3/1993 | Logan et al. ................ 361/234 |
| 5,350,479 A | 9/1994 | Collins et al. .............. 156/345 |
| 5,382,311 A | 1/1995 | Ishikawa et al. ............ 156/345 |
| 5,542,559 A | 8/1996 | Kawakami et al. .......... 216/67 |
| 5,646,814 A | 7/1997 | Shamouilian et al. ....... 361/234 |
| 5,720,818 A | 2/1998 | Donde et al. ............... 118/500 |
| 5,744,812 A | 4/1998 | Oh et al. ................ 250/492.21 |

FOREIGN PATENT DOCUMENTS

| EP | 0439000 | 1/1991 |
| EP | 0601788 | 12/1993 |
| JP | 09017850 | 1/1997 |

*Primary Examiner*—Thi Dang
(74) *Attorney, Agent, or Firm*—Ashok Janah; Joseph Bach

(57) ABSTRACT

A gas feed-through 150 to provide gas to a plasma chamber 10, comprises a dielectric insert 155 having a passage 160 that allows the gas to be flowed therethrough, and a electrically conducting cup 165 around a portion of the passage. The electrically conducting cup 165 is shaped to reduce plasma formation in the gas feed-through 150.

19 Claims, 5 Drawing Sheets

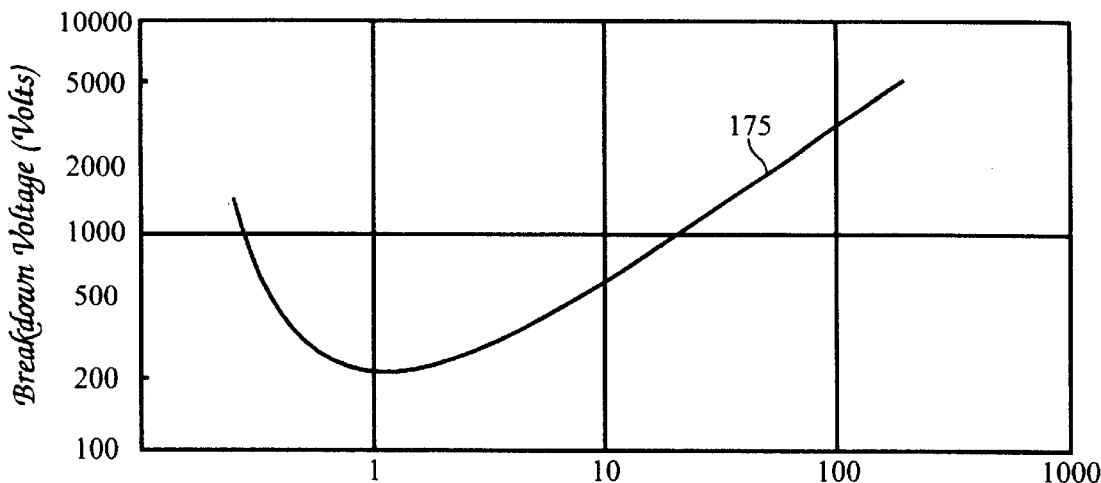
Fig. 5  Pressure - Distance (mm Hg-cm)
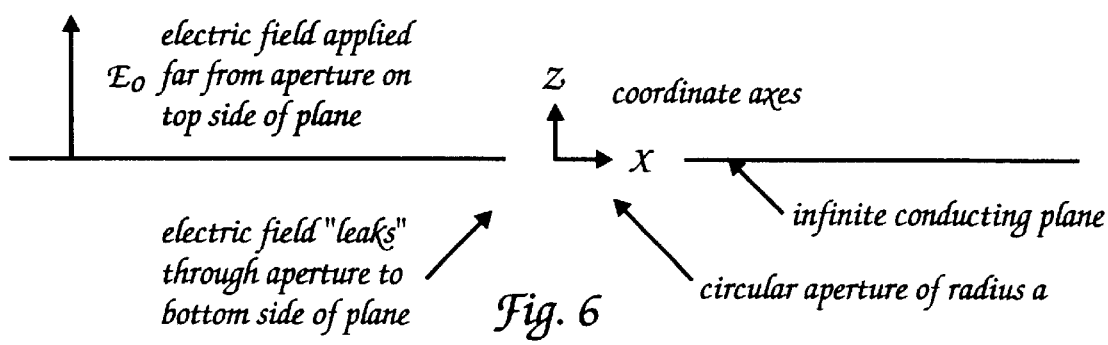
Fig. 6
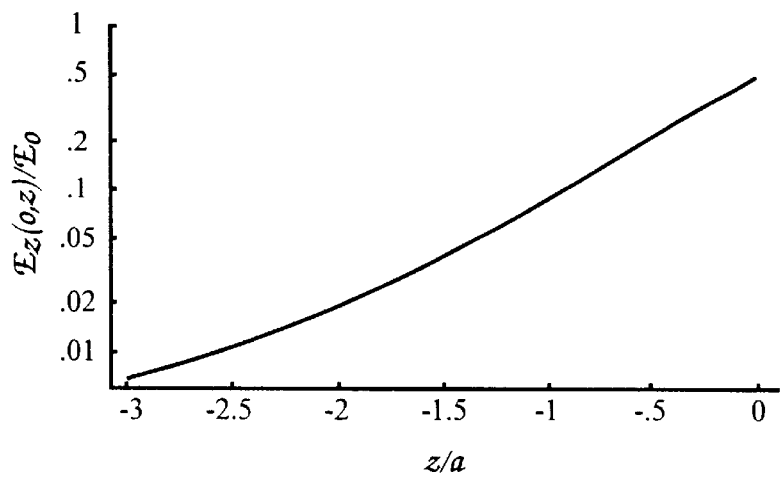
Fig. 7

CHAMBER HAVING IMPROVED GAS FEED-THROUGH AND METHOD

BACKGROUND

The present invention relates to a chamber having a gas feed-through for introducing gas into the chamber.

In the fabrication of electronic devices, semiconductor, dielectric and conductor materials, such as for example, polysilicon, silicon dioxide, and metal containing layers, are deposited on a substrate and etched to form features such as patterns of gates, vias, contact holes and interconnect lines. These features are typically formed by chemical vapor deposition (CVD), physical vapor deposition (PVD), oxidation and etching processes. For example, in a typical etching process, a patterned mask of photoresist or oxide hard mask is formed on a deposited layer by photolithographic methods and exposed portions of the deposited layer are etched by an energized halogen gas, such as $Cl_2$, HBr, and $BCl_3$. In a typical CVD process, a gas provided in the chamber is decomposed to deposit a layer on the substrate. In PVD processes, a target facing the substrate is sputtered to deposit the target material onto the substrate.

In these processes, gas is supplied to the chamber through a gas feed-through. For example, the gas feed-through can be used to feed process gas into the chamber for processing of the substrate. The gas feed-through can also be used to feed gas to a surface of a support below the substrate, the gas being useful for enhancing heat transfer rates to and from the substrate, and for reducing deposition of byproducts on the backside or edges of the substrate. However, when an electrode in the chamber is electrically biased, for example, to energize a plasma in the chamber or generate electrostatic forces, the electric potential applied to the electrode can cause plasma formation, arcing, and glow discharge in the gas passing through the gas feed-through. Such arcing and glow discharges damage the gas feed-through and adjacent chamber components or surfaces. Arcing can also cause catastrophic failure of the gas feed-through upon plasma ignition; randomness (or wide error band) of breakdown voltage across a large substrate; sensitivity of breakdown voltage to material imperfections, voids, and gaps at interfaces within the gas feed-through; and cause the applied voltage at which an ignited gas in the gas feed-through is extinguished to be more than an order of magnitude smaller than the voltage at which it is ignited. All these effects impede the efficient processing of substrates or other workpieces in the chamber.

Commonly assigned U.S. patent application Ser. No. 08/965,690, filed on Nov. 6, 1997, entitled "Electrostatic Chuck Having Improved Gas Conduits" to Weldon, et al., which is incorporated herein by reference, describes a ceramic insert that is positioned in a conduit in a ceramic electrostatic chuck (which has an electrode that is charged to electrostatically hold an overlying substrate) to reduce plasma formation in the conduit. While this device reduces plasma formation in the conduit it has been observed that plasma formation still often results in the conduit when the voltage applied to the electrode exceeds certain levels. In addition, instantaneous changes in electrical potential can ionize the gas adjacent to the gas feed-through, particularly when the diameter of the conduit is relatively large and provides a long mean free path that leads to avalanche breakdown of gas molecules in the conduit. For example, arcing has been occasionally observed at voltages of about 2 KVp and at high frequencies of 13.56 MHz.

Thus there is a need for a gas feed-though that reduces plasma formation, glow discharges and arcing, during passage of gas through the feed-through. There is also a need for a chamber that can process a substrate in a gas while reducing the incidence of plasma formation of gas in conduits that feed gas into the chamber. There is a further need for a method of providing gas to a chamber while simultaneously reducing the incidence of plasma formation in the feed-through.

SUMMARY

In one aspect, the present invention relates to a gas feed-through that provides gas to a chamber, the gas feed-through comprises a dielectric insert having a passage that allows the gas to be flowed therethrough, and a electrically conducting cup around a portion of the passage. The electrically conducting cup is shaped to reduce plasma formation in the gas feed-through during the passage of gas in the feed-through into a chamber.

In another aspect, the present invention comprises an substrate support assembly comprising a dielectric layer covering an electrode that may be charged with an RF voltage; and a gas feed-through comprising a dielectric insert having a passage through which gas may be passed to the surface of the dielectric layer, and a electrically conducting cup around a portion of the passage.

In yet another aspect, the present invention comprises a chamber capable of processing a substrate in a plasma, the chamber comprising a gas feed-through comprising a dielectric insert having a passage through which a gas may be passed into the chamber, and a electrically conducting cup around at least a portion of the passage.

In still another aspect, the present invention comprises a method of processing a substrate in a chamber, the method comprising the step of passing a gas through a passage in a dielectric insert of a gas feed-through, and maintaining a electrically conducting cup around a portion of the passage to reduce an incidence of plasma formation in the passage.

DRAWINGS

These features, aspects, and advantages of the present invention will become better understood with regard to the following description, appended claims, and accompanying drawings which illustrate examples of the invention, where:

FIG. 5 is a graph showing a Paschen plot for hydrogen gas;

FIG. 6 is a schematic representation of an analytical model used to determine the breakdown voltage in a gas between conducting planes;

FIG. 7 is a graph of $E_z(0,z)/E_0$ versus $z/a$ for an analytical model of a gap distance in a conducting plane;

Figure 8:
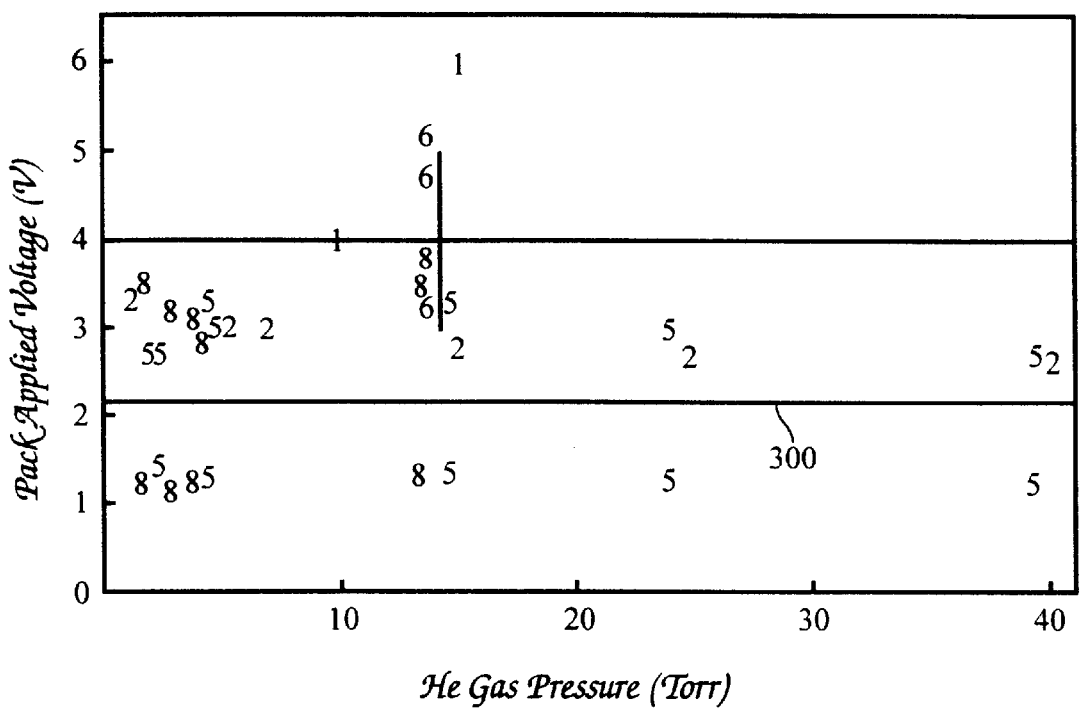
Figure 9:
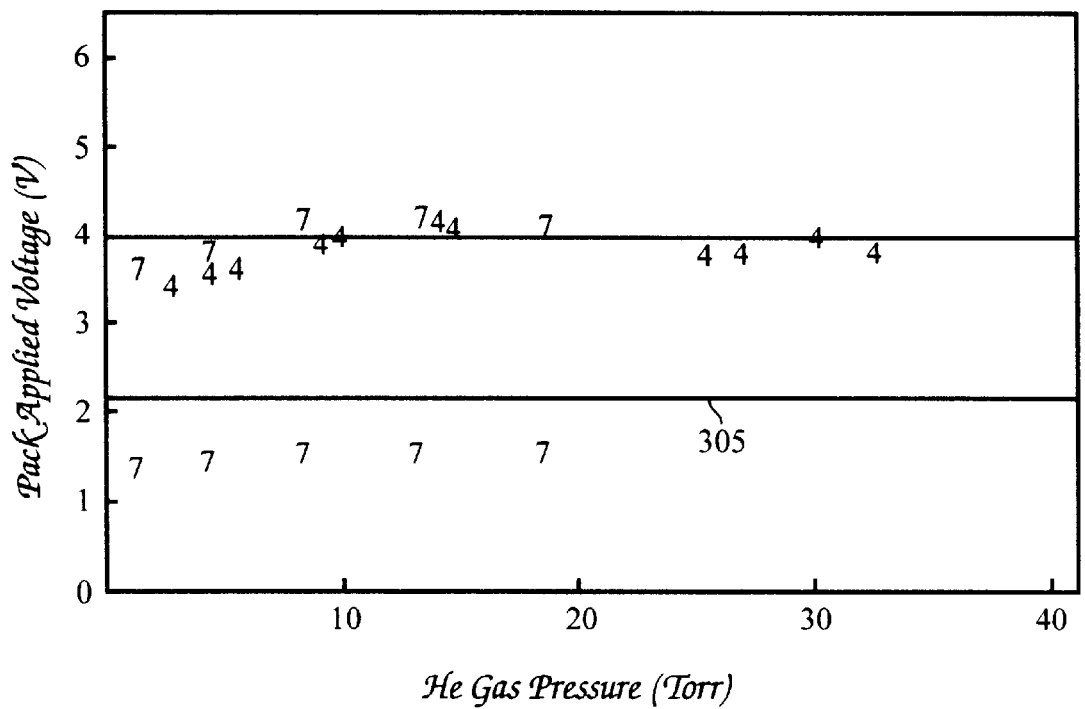

FIG. 8 is a graph of the peak applied voltage (kV) versus helium gas pressure (T) for a dual zone porous ceramic gas feed-through with an aspect ratio of $-z/2a=1$, and a 1 inch spacing between conductors; and FIG. 9 is a graph of the peak applied voltage (kV) versus helium gas pressure (T) for a dual zone porous ceramic gas feed-through with an aspect ratio of $-z/2a=0.75$, and a 1.4 inch spacing between conductors.

DESCRIPTION

A chamber 10 according to the present invention is for example, an MxP+OXIDE ETCH chamber, commercially available from Applied Materials Inc., Santa Clara, Calif., as shown in FIG. 2, and generally described in commonly assigned U.S. Pat. Nos. 4,842,683 and 5,215,619 to Cheng, et al; and U.S. Pat. No. 4,668,338 to Maydan, et al., all of which are incorporated herein by reference. Such chambers can be used in a multi-chamber integrated process system as for example, described in U.S. Pat. No. 4,951,601 to Maydan, et al., which is also incorporated herein by reference. The particular embodiment of the chamber 10 shown herein, is suitable for processing of semiconductor substrates 15, is provided only to illustrate the invention, and should not be used to limit the scope of the invention.

During processing, the chamber 10 is evacuated to a low pressure of less than about 500 mTorr, and a substrate 15 is transferred to a plasma zone 20 of the chamber 10 from a load lock transfer chamber (not shown) maintained at vacuum. The substrate 15 is held on a support 18, which optionally comprises a mechanical or electrostatic chuck 25. A typical electrostatic chuck 25 comprises an electrostatic member 30 comprising a dielectric layer 35 having a surface 40 adapted to receive the substrate 15, and the surface 40 having grooves 45 in which a heat transfer gas, such as helium, is held to control the temperature of the substrate 15. The dielectric layer 35 covers an electrode 50—which may be a single conductor or a plurality of conductors—which is chargeable to electrostatically hold the substrate 15. After the substrate 15 is placed on the chuck 25, the electrode 50 is electrically biased with respect to the substrate 15 by an electrode voltage supply and RF generator 55 to electrostatically hold the substrate 15. A base 60 below the electrostatic chuck 25 supports the chuck, and optionally, is also electrically biased with an RF bias voltage.

Process gas is introduced into the chamber 10 through a gas supply 65 that includes a first gas supply 70 and one or more gas nozzles 75 terminating in the chamber 10. The gas in the chamber 10 is typically maintained at a low pressure. A plasma is formed in the plasma zone 20 from the gas by applying an RF current to an inductor coil (not shown) encircling the process chamber and/or by applying an RF current to the electrode 50 in the chamber 10. In etching processes, the plasma is typically capacitively generated by applying an RF voltage to the electrode 50 (which serves as the cathode electrode) and by electrically grounding the sidewalls 85 of the chamber 10 to form the other (anode) electrode 50. Alternatively, an RF current is applied to an inductor coil (not shown) to inductively couple energy into the chamber 10 to generate the plasma in the plasma zone 20. The frequency of the RF current applied to the electrode 50 or to the inductor coil (not shown) is typically from about 50 KHz to about 60 MHz, and more typically about 13.56 MHz.

The plasma can also be enhanced by electron cyclotron resonance in a magnetically enhanced reactor in which a magnetic field generator 90, such as a permanent magnet or electromagnetic coils, provides a magnetic field that increases the density and uniformity of the plasma in the plasma zone 20. Preferably, the magnetic field comprises a rotating magnetic field with the axis 195 of the field rotating parallel to the plane of the substrate 15, as described in U.S. Pat. No. 4,842,683, issued Jun. 27, 1989, which is incorporated herein by reference. Spent process gas and etchant byproducts are exhausted from the chamber 10 through an exhaust system 95 capable of achieving a minimum pressure of about $10^{-3}$ mTorr in the chamber 10. The exhaust system 95 comprises an exhaust conduit 100 that leads to a plurality of pumps 105, such as roughing and high vacuum pumps, that evacuate the gas in the chamber 10. A throttle valve 110 is provided in the exhaust conduit 100 for controlling the pressure of the gas in the chamber 10. Also, an optical endpoint measurement technique is often to determine completion of the etching process by measuring a change in light emission intensity of a gas species in the chamber 10 or measuring the intensity of light reflected from a layer being processed on the substrate 15.

During processing of the substrate 15, heat transfer gas is provided to the interface between the substrate 15 and the dielectric layer 35 of the chuck 25, to enhance heat transfer rates therebetween. The heat transfer gas is provided via gas conduits 115 that extend through one or more of the electrode 50 and dielectric layer 35. A second gas supply 120 supplies heat transfer gas to the conduits 115 via a gas supply channel 125. The conduits 115 have one or more outlets 130 that deliver the gas to the surface 40 of the chuck 25. The substrate 15 covers the edges of the dielectric layer 35 to reduce leakage of heat transfer gas from the edge of the chuck 25. The grooves 45 on the surface 40 of the dielectric layer 35 are sized and distributed to hold heat transfer gas to heat or cool substantially the entire backside of the substrate 15, such as for example, a pattern of intersecting grooves 45 radiating across the dielectric layer 35. Preferably, at least one conduit 115 terminates in one of the grooves 45, and more preferably, the conduits 115 terminate at one or more intersections of the grooves 45. Alternative groove patterns are described in, for example, U.S. patent application Ser. No. 08/189,562, entitled "Electrostatic Chuck" by Shamouilian, et al., filed on Jan. 31, 1994, which is incorporated herein by reference. The gas conduits 115, gas supply channel 125, and grooves 45 are formed by conventional techniques, such as drilling, boring, or milling. Typically, the heat transfer gas comprises helium or argon which is supplied at a pressure of about 5 to about 30 Torr; however, other gases such as $CF_4$ can also be used.

Figure 1:
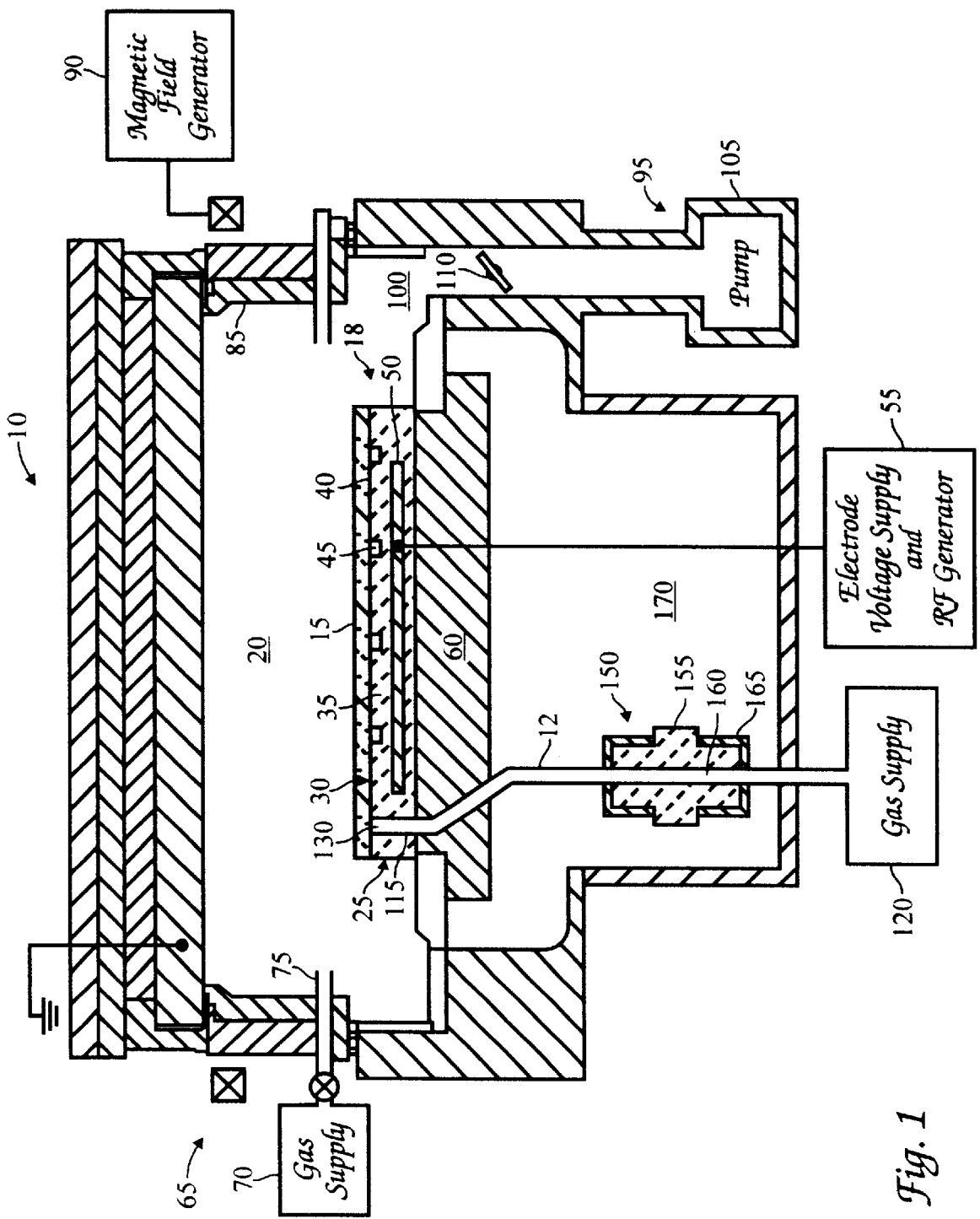
FIG. 1 is a schematic sectional view of a chamber according to the present invention.

FIG. 1 illustrates a schematic of a gas feed-through 150 to provide gas to the plasma chamber 10, the gas feed-through comprising a dielectric insert 155 having an internal passage 160 for passing gas therethrough, and a surrounding electrically conducting cup 165 that serves as an electrical shield by enclosing substantially the entire passage. While the gas feed-through 150 is shown to be in a lower portion 170 of the chamber 10 that lies below the process zone, the gas feed-through can be located anywhere in the pathway of a gas from a gas supply 65 to the surface 40 of the chuck 25, including in the sidewall 85 of the chamber 10, inside the chuck, or in the base 60 below the chuck. Also, in the example provided herein to illustrate the invention, the gas feed-through 150 is used to supply heat transfer gas to the surface 40 of a support, and the gas feed-through and support form a substrate support assembly 18. However, the gas feed-through 150 could also be used to supply process gas to the chamber 10 for processing of the substrate 15, suitable process gas including gases for etching a substrate, for depositing material on the substrate by chemical vapor deposition, or for assisting in sputtering material from a target by physical vapor deposition.

Figure 2A:
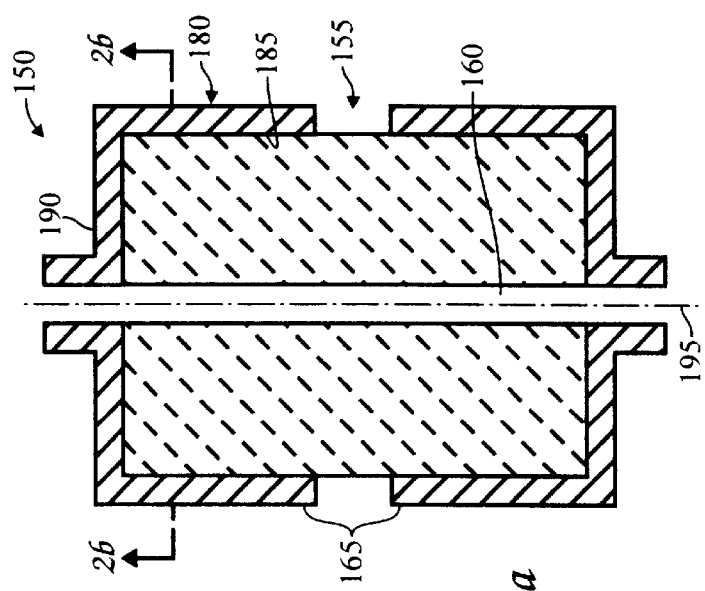
FIG. 2a is a schematic side view of a gas feed-through according to the present invention.
Figure 2B:
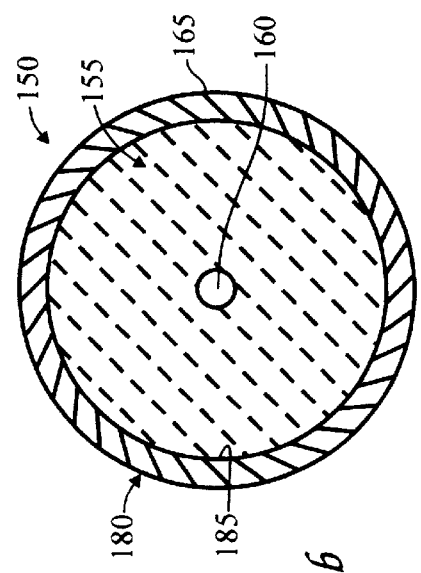
FIG. 2b is a schematic top view of the gas feed-through of FIG. 2a viewed along section 2b.

Referring to FIGS. 2a and 2b, the dielectric insert 155 comprises a gas passage 160 through a dielectric material that has a dielectric constant that is sufficiently high to reduce plasma formation in or adjacent to the passage. The dielectric material can be a ceramic material such as $Al_2O_3$, AlN, $SiO_2$, $Si_3N_4$, and mixtures thereof. More preferably, the dielectric insert 155 comprises aluminum oxide or a mixture of aluminum oxides and silicon oxides, as described below. Alternative dielectric materials include thermoplastic and thermoset polymers, such as for example, polyimide, polyketone, polycarbonate, and TEFLON (a tetrafluroethylene polymer manufactured by Dupont de Nemours Company Wilmington, Del.). The breakdown strength of the dielectric material is preferably from about 4 to 40 volts/micron. In this version, the dimensions of the passage 160 are sufficiently small to further reduce plasma formation therein (by reducing the mean free path of the gas in the passage) and preferably comprise a diameter equal to or less than about 0.4 mm. The passage 160 can extend through the spaces of interconnected pores, passageways formed by microcracks, or between ceramic grains that are separated from another and along their grain boundary regions.

The breakdown of a gas in a gap (such as within the passage in the dielectric insert 155 or at an interface of the dielectric insert and surrounding conducting metal structures) obeys a Paschen curve, an example of which is shown for $H_2$ in FIG. 5, as described in more detailed in Von Engle, "Ionized Gases" (Oxford University Press, 1955) which is incorporated herein by reference. This empirical curve 175 shows the breakdown voltage of the gas as a function of gas pressure times a gap width d of the gap. In the experiment that was performed to determine this portion 170, the distance d represents the gap between two clean smooth conducting plates 190 across which the voltage is applied. In practice, this distance represents a maximum open distance parallel to an applied electric field. A counterintuitive but essential feature of the Paschen curve is that the breakdown voltage of a device is increased at any pressure simply by decreasing the gap distance d. This is because lowering d lowers the breakdown voltage across the gap or void for a given applied voltage across the device. In other words, in a fixed electric field, the breakdown voltage across a gap becomes smaller as the gap itself becomes smaller, and according to the Paschen curve, this increases the breakdown voltage of the device.

In one aspect of the present invention, an electrically conducting cup 165 is positioned around at least a portion of the passage 160. The electrically conducting cup 165 is shaped to reduce plasma formation in the gas feed-through 150. By "electrically conducting cup" it is meant a cup comprising metal-containing material, such as aluminum, copper, platinum, or metal suicides, such as WSix. The shield comprises a jacket 180 encircling the passage 160 in the dielectric insert 155 of the gas feed-through 150. The jacket 180 comprises sidewalls 185 that enclose the passage 160. For a passage 160 that is essentially tubular, such as a bored hole the sidewalls 186 conform to and follow the shape of the hole. The sidewalls 185 terminate at endplates on either end of the passage 160, the entire structure forming a cup-shaped shield that surrounds the passage 160. Two opposing cup-shaped. shields are oriented to face one another and are centered along an axis 195 of the passage 160. These cup-shaped shields are cylindrical in shape and have an aspect ratio of width to height that is sufficiently low to reduce plasma formation in the gas feed-through 150. The reduction of the electric field passing through the passage 160 depends on the aspect ratio of the electrically conducting cups 165. To reduce the electric field strength, preferably, the aspect ratio of the width to height Is preferably from about ⅓ to about 3, and more preferably from about ⅔ to about 1.5. The ratio of extinguishing to ignition voltage is higher than for shallow cups and nearly an order of magnitude higher than if no cups were present. This permits the gas feed-through 150 to extinguish any plasma formation and thereby mitigate damage to any material within the base, in the electrically conducting cup itself, or adjacent O-ring.

The reduction in the electric field at the bottom of the cups depends on the aspect ratio (x) of the cups to effective opening diameter 2a. The field reduction may be estimated by an analytic calculation, as shown in FIG. 6. In this calculation, a conducting plane with a circular aperture of radius a has an electric field $E_0$ applied perpendicular to the plane. The electric potential behind the aperture (z<0) is given by:

$$\phi(0,z)=E_0 a[1+(z/a)\text{arc tan}(-a/z)]/\Pi \qquad (1)$$

Differentiating to determine the electric field $E_z=-\partial/\phi/\partial z$, we find (for z<0). J. D. Jackson, "Classical Electrodynamics," $2^{nd}$ ed. (Wiley, N.Y., 1975), which is incorporated herein by references.

$$E_z(0,z)=E_0[(a/z)/(1+(a/z)^2)-\text{arc tan}(-a/z)]\Pi \qquad (2)$$

Equation (2) may be used to estimate the ratio between the electric field a distance −z behind the aperture and the applied field. It is probably an underestimate of the actual field reduction in the gas feed-through 150 because of the field cancellation effect of the conducting sidewalls 185, which are not included in the analytic calculation. A plot of $E_z(0, z)/E_0$ as a function of z/a is shown in FIG. 7. One can see that at a distance of −z/2a=1 behind the aperture, the electric field is about fifty times smaller than the field applied to the plane. Thus, in a conducting cup with an aspect ratio of 1, the electric field at the bottom of the hole will be about fifty times smaller than the applied electric field. This significantly reduces the incidence of arcing or glow discharges in the gas passing through or adjacent to the passage 160 in the dielectric insert 155, and in the gap at the interface between the dielectric insert and the cup.

Figure 3A:
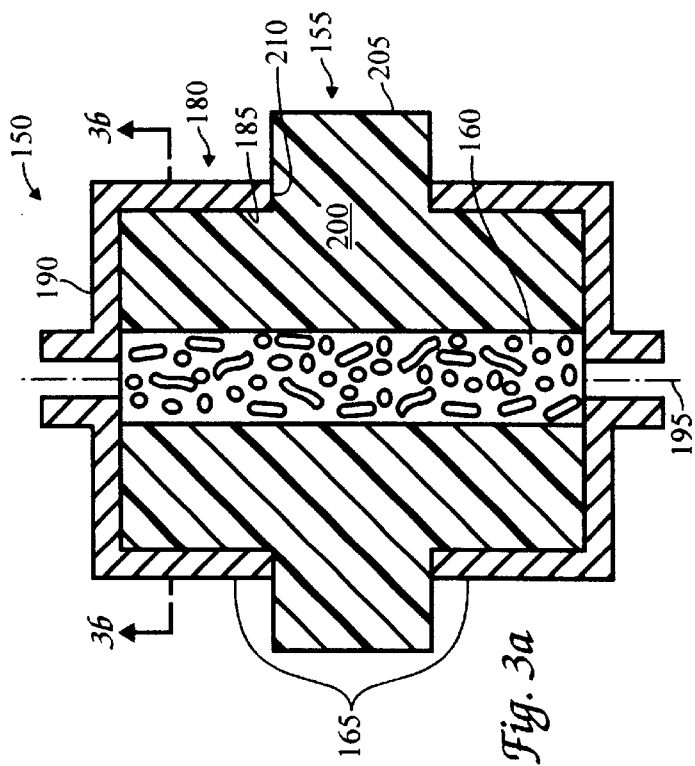
FIG. 3a is a schematic side view of another embodiment of a gas feed-through according to the present invention.
Figure 3B:
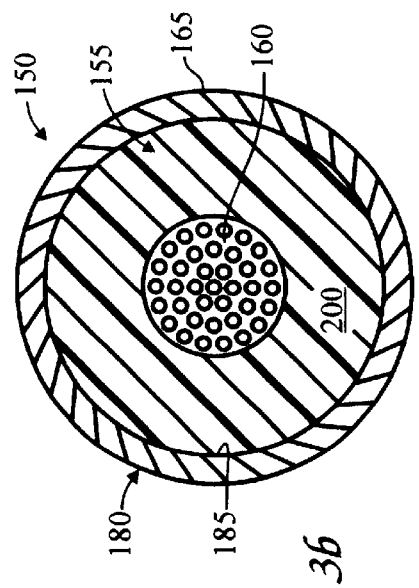
FIG. 3b is a schematic top view of the gas feed-through of FIG. 3a viewed along section 3b.

In a preferred version, as shown in FIGS. 3a and 3b, the dielectric insert 155 comprises a porous, high surface area material along the walls of the passage 160 in the dielectric insert. This porous ceramic has voids or pockets with an effective dimension d that are linked to one another and supported by a web of ceramic material. The porous material comprises a density fraction less than unity where unity refers to the density of solid ceramic. It is believed that the porous materials limit the kinetic energy of any free electrons, thereby reducing the possibility of avalanche breakdown leading to plasma formation in the passage 160 of the dielectric insert 155. More specifically, the small diameter pores have a small mean free path length inside the pore that serves to reduce the kinetic energy of the gas species traveling therethrough. In addition, the pore size of the porous ceramic represents the gap size d, from which the breakdown voltage may be estimated from the Paschen curve. Preferably, the porous material comprises pores that interconnect to form one or more continuous passages having small dimensions (i.e., diameter or length) which prevent an avalanche breakdown and plasma formation in the holes. Typically, the passageways through the pores have diameters ranging from about 1 μm to about 1 mm. The volume percent porosity of the porous material is preferably from about 30 to about 90 volume %, and more preferably from about 60 to about 80 volume %. Also, the porous material preferably comprises a surface area from about 20 cm$^2$/g to about 300 cm$^2$/g.

Preferably, the porous ceramic material is formed within a sleeve 200 composed of a substantially dense or substantially non-porous dielectric material, such as a ceramic or polymer, as shown in FIGS. 3a and 3b. The sleeve 200 comprises a non-conducting media having a low dielectric constant that is shaped and sized to fill the space between the dielectric insert 155 and the surrounding shield to reduce plasma formation therein. Also, the dense ceramic sleeve 200 reduces leakage of gas from the passages 160 within the porous ceramic to the external environment. In addition, the sleeve 200 assists in holding together the porous ceramic structure during the manufacturing process. The dense ceramic of polymer sleeve 200 typically has a pore volume of less than about 10%.

Figure 4A:
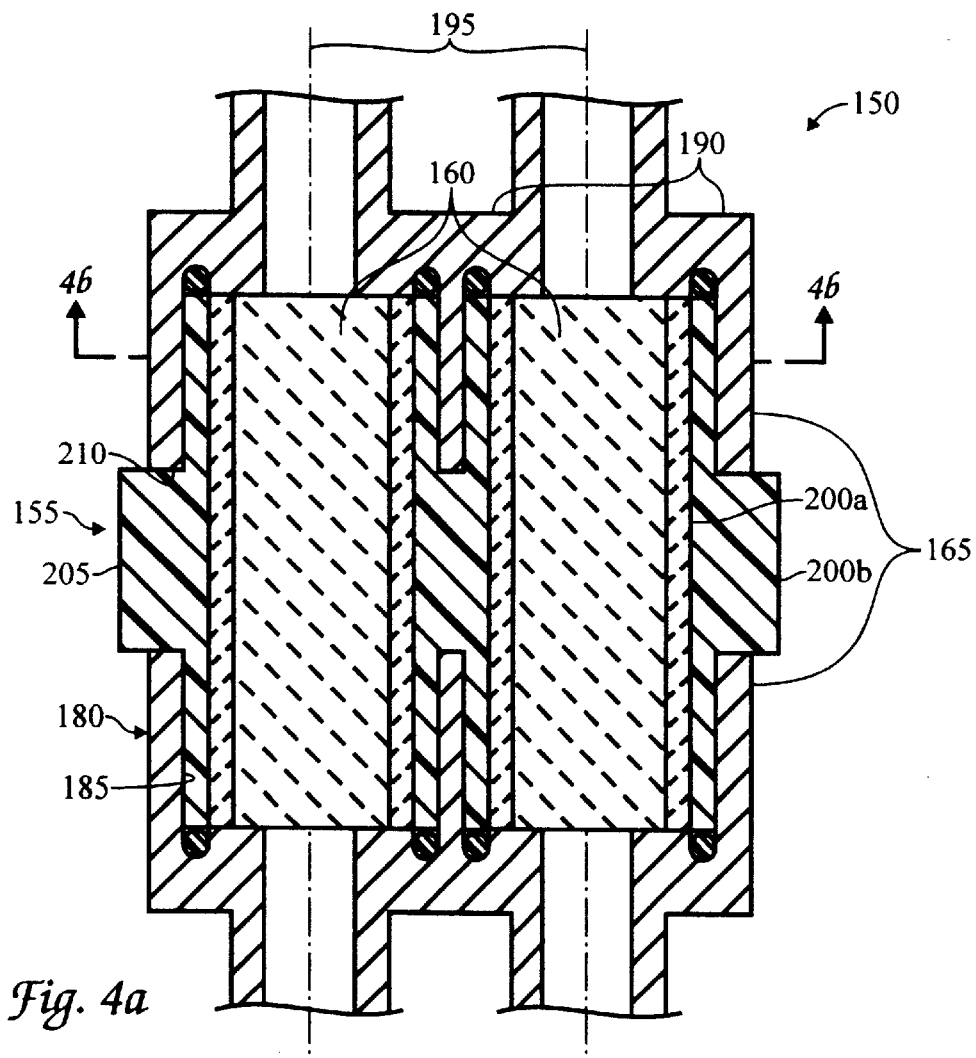
FIG. 4a is a schematic side view of yet another embodiment of the gas feed-through comprising dual gas flow passages.
Figure 4B:
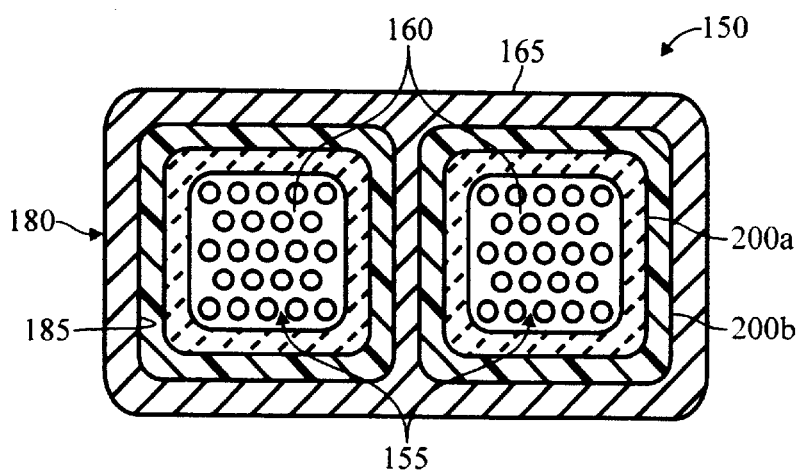
FIG. 4b is a schematic top view of the gas feed-through of FIG. 4a viewed along section 4b.

More preferably, the gas feed-through 150 comprises a plurality of sleeves that enclose the porous ceramic, including an inner sleeves 200a of dense ceramic and an outer sleeve 200b of polymer, as shown in FIGS. 4a and 4b. The dual sleeve 200a,b facilitates manufacture of the gas feed-through 150 and also serves to form a good vacuum-tight seal around the porous ceramic that can withstand low vacuum pressures without leakage of gas therethrough. It is also important to minimize any interfacial gaps between the porous ceramic, the dense ceramic inner sleeve 200a, and the polymer outer sleeve 200b, and thereby ensuring a tight fit between these components. It is further desirable to minimize the gap between the polymer sleeve 200b, the ceramic sleeve 200a, and the porous ceramic dielectric insert 155, and more preferably for the gap to be essentially zero, to reduce plasma formation in the gap. One way to achieve a tight fit between a polymer outer sleeve 200b that encloses a ceramic inner sleeve 200a is to bore a hole in the polymer outer sleeve that has a slightly smaller diameter than the cross-section of the ceramic inner sleeve. After heating the polymer outer sleeve, the ceramic inner sleeve 200a is inserted into the hole to provide a tight fitting joint. In this version, preferably, the polymer outer sleeve 200b comprises polycarbonate or Lexan®, which is a brand having product designations GE-101 and GE-103, General Electric, Pittsville, Mass.

Another version of the gas feed-through 150, as shown in FIGS. 4a and 4b, comprises a plurality of gas passages 160. This version is useful for supplying heat transfer gas to multiple zones on a surface 40 of an electrostatic chuck 25, as for example described in U.S. patent application Ser. No. 09/312,909, entitled "Chuck Having Pressurized Zones of Heat Transfer Gas," to Shamouilian, et al., filed on May 17, 1999. In this version, two dielectric inserts 155 each comprise a passage 160 for the gas to flow therethrough. The two dielectric inserts 155 are separated by a conducting cup-shaped metal shield that has a common wall. A first sleeve made from Lexan™, comprises a casing having a central stub 205 that projects outwardly relative to the passage 160, and also serves as a stop for the ends 210 of the electrically conducting cup-shaped shield. The central stub 205 extends outwardly to increase the path length for coupling of the electric field between the ends 210 of the cup-shaped shields to reduce plasma arcing or glow discharges across the ends of the cup-shaped shields. The dielectric insert 155 comprises a porous ceramic insert having interconnected pores that serve to form the passage 160. In addition, the inner and outer sleeves 200a,b comprise ceramic and polymer materials, respectively.

EXAMPLES

The following examples illustrate the principles of the present invention for reducing the incidence of plasma formation in the passage 160 of a gas feed-through 150 for feeding gas to a chamber 10. However, the apparatus and method can be used in other applications as would be apparent to those skilled in the art, and the scope of the present invention should not be limited to the illustrative examples provided herein.

Four heat transfer gas feed-throughs 150 were tested on an eMxP+98 chamber having a high voltage RF and DC powered electrostatic chuck 25. Each gas feed-through 150 comprised a pair of electrically conducting cup-shaped shields encircling the dielectric insert 155 comprising porous ceramic. The porous ceramic had interconnected pores which formed the passage 160 for the heat transfer gas.

One of the gas feed-through 150 was modified to investigate the effect of the depth of the cup-shaped shield on breakdown voltage. The tests demonstrated that the gas feed-through 150 had adequate breakdown voltages that exceeded about 2.7 KVp RF volts. Also the endplates of the cup-shaped shield were not damaged even when the shield arced in a plasma discharge in one experiment, and the only noticeable change to the porous ceramic was a yellowing of the porous ceramic in regions where the plasma discharge occurred. This demonstrated the effectiveness of the gas feed-through 150.

The other gas feed-throughs 150 were modified and tested as shown in FIGS. 8 and 9. It should be noted that in a typical eMxP+chamber, the maximum voltage applied to the cathode electrode 50 is 4256$V_{pp}$, which is limited by the interlock trip. This RF voltage corresponds to a DC bias applied by autobias of −1850$V_{dc}$. The combined peak voltage presented to the He feed-through is therefore 1−1850$V_{dc}$−2128$V_{prf}$1=3.98 KV, assuming the feed-through is equally sensitive to RF and DC components (which it may not be, as discussed below). Thus, the maximum peak voltage requirement has only an RF component, equal to 2.13 $KV_{prf}$. In these Figures, the upper horizontal line represents the maximum RF+DC voltage for the eMxP+ chamber, while the lower horizontal line represents the RF component only, and represents the maximum voltage applied to the eMxP+98 chamber.

FIG. 8 shows a graphical summary of the performance of gas feed-throughs 150 comprising dual gas feed pathways in porous ceramic, and having a electrically conducting cup 165 with an aspect ratio of −z/2a=1 and a 1 inch spacing between the endplates of the electrically conducting cup. The data points below the line 300 indicate breakdown voltages, and the data points above the line 300 show the corresponding plasma extinguishing voltages. The data points numbered 1 are for less than ten minutes of pumping and purging with He. The data point labeled 1 is the breakdown voltage after the gas feed-through 150 has already arced. The data points labeled 2 were taken on the same gas feed-through 150 which were pumped and purged for several hours. All other data points were taken after the gas feed-throughs 150 had been pumped and purged for at least 18 hours. Oil contamination was considered a possible reason for the drop in breakdown voltage because the portion of the porous ceramic that arced turned yellow in color. The data points labeled 5 and 6 correspond to the first set of porous ceramic gas feed-throughs 150 which were ultrasonically cleaned in solvent to dissolve any residual oil or other organic matter. Then the vacuum system was cleaned with solvent and changed to use a dry pump. There did not appear to be any difference in performance between these data sets, from which one concludes that the drop in breakdown voltage over time was due to out-gassing from the pores in the ceramic. It should be also noted that data points 1 through 6 are for one set of porous ceramic while 8 is for a different set having larger voids at their ends 210 which also had relatively little influence on the performance of the gas feed-through 150. This is due to the estimated factor of a fifty times lower electric field strength at the bottom of the conducting electrically conducting cup 165. An additional benefit of the lower electric field is the lack of damage to the endplates even at a low aspect ratio. In this case, yellowing of the porous ceramic occurred due to the exposure of the ceramic to ultraviolet light from the plasma discharge. As a further affirmation of the reduction in electric field strength at the bottom of the electrically conducting cups 165, it was noticed visually that approaching the breakdown voltage the plasma glows only in a small ½" region between the endplates of the electrically conducting cup. At slightly higher voltages, the plasma fills up the entire porous ceramic dielectric insert 155.

The top two data points numbered 6, in FIG. 8, have a vertical line through them that represents the DC component of voltage applied. In these two cases, a constant 3 $KV_{prf}$ was applied and the negative DC voltage was increased until breakdown occurred. Thus the DC voltage has less effect on the breakdown voltage of this version of the gas feed-through 150 than the peak RF voltage because of charge migration. In this design, the porous ceramic has pores with thin ceramic walls that are linked together. When a charge flows through the ceramic, the voltage drops across each pore may decrease with the charge building up across its ceramic walls. The DC electric field will then appear mostly across the ceramic rather than the pores containing the Helium gas. The DC voltage is thus not effective in causing voltage breakdown.

FIG. 9 shows a summary of performance of the version of the gas feed-through 150 comprising a porous ceramic dielectric insert 155 of FIGS. 4a and 4b. In the Figure the data points below the line 305 indicate breakdown voltages, and the data points above the line 305 show the corresponding plasma extinguishing voltages. In these tests, the depth of each of the cup-shaped shield was decreased by 0.2", which lowers the aspect ratio to −z/2a=0.75. Based on this scale, one would expect the breakdown voltage to increase by the ratio of the gaps, 1.4"/1"=40%. However, an observed disadvantage of increasing the gap is a yellow-brown staining due to a more intense plasma discharge. Because this may damage the O-ring or cause contamination, the larger aspect ratio design was chosen. Also, the gas feed-through 150 had an outer sleeve of Lexan™ which exhibited higher dielectric heating than many plastics; however, it has good mechanical rigidity and low dielectric constant 92.96 at 1 MHz. The dielectric heating can be estimated from the dissipation factor of Lexan, which is 0.0100 at 1 MHz. The capacitance of the He feed-through assembly was measured using an LCR meter as 6 pF. Consequently, the capacitive reactance of the gas feed-through is 1/ωC=1.96 KΩ at 13.56 MHz. Then the equivalent series resistance R=0.01×1.96 KΩ=19.6 Ω. The dielectric heating may then be estimated from $I^2R = \omega^2 C^2 V^2 R = 12.4$ W at $2200 V_{prf}$—which is an acceptable amount of dielectric heating. The gas feed-through 150 became perceptibly warm (perhaps 30° C.) to the touch after running for tens of minutes at voltages near 3 $KV_p$. It was also observed that the shorter cup version experienced less heating—which it should because its capacitance is lower.

The electrically conducting cups 165 are found to minimize the electric field at the interface between the electrically conducting cup and porous ceramic material and between the electrically conducting cup and the Lexan with O-ring seals. Another advantage is that the breakdown voltage is independent of any imperfections in metal endplates, the presence of features such as O-ring grooves 45 or the rings themselves, or imperfections like possible large voids at the ends 210 of the porous ceramic dielectric insert 155. The reduced electric field at the two endplates of the gas feed-through 150 makes the breakdown voltage of the gas feed-through very consistent and repeatable.

The present gas feed-through 150 provides a plasma extinguishing voltage more than one-third the plasma ignition voltage. In addition, the gas feed-through 150 may also be scaled up in size to achieve desired ignition or extinguishing voltages.

While the present invention has been described in considerable detail with reference to certain preferred versions, many other versions should be apparent to those of ordinary skill in the art. For example, the gas feed-through 150 can comprise alternative shapes and configurations of dielectric inserts 155 and metal shields. Therefore, the spirit and scope of the appended claims should not be limited to the description of the preferred versions contained herein.

What is claimed is:

1. A gas feed-through to provide gas to a plasma chamber, the gas feed-through comprising a dielectric insert having a passage therein that allows the gas to be flowed through the passage, and two opposing electrically conducting cups around a portion of the dielectric insert and the passage.

2. A gas feed-through according to claim 1 wherein the electrically conducting cups are shaped to reduce plasma formation in the gas feed-through.

3. A gas feed-through according to claim 1 wherein the electrically conducting cups comprise a cylindrical portion encircling the passage in the dielectric insert.

4. A gas feed-through according to claim 3 wherein the cylindrical portion comprises an aspect ratio of width to height that is sufficiently low to reduce an incidence of plasma formation in the gas feed-through.

5. A gas feed-through according to claim 3 wherein the cylindrical portion comprises an aspect ratio of width to height that is from about ⅓ to about 3.

6. A gas feed-through according to claim 1 wherein the dielectric insert comprises a porous ceramic.

7. A gas feed-through according to claim 6 wherein the porous ceramic comprises a pore volume of from about 30 to about 90 volume %.

8. A gas feed-through according to claim 7 wherein the passage is formed through interconnected pores of the porous ceramic.

9. A gas feed-through according to claim 1 wherein the dielectric insert further comprises one or more sleeves of a substantially non-porous ceramic or polymer.

10. A chamber comprising the gas feed-through of claim 1 and a gas supply to provide gas to the chamber, the gas supply comprising a conduit having the gas feed-through therein.

11. A gas feed-through according to claim 1 wherein one of the electrically conducting cups comprises a first end and tho other electrically conducting cup comprises a second end, and the dielectric insert is adapted to be a stop between the first and second ends.

12. A chamber capable of processing a substrate in a plasma, the chamber comprising a gas feed-through comprising a dielectric insert having a passage therein through which a gas may be passed into the chamber, and two opposing electrically conducting cups around at least a portion of the dielectric insert and the passage.

13. A chamber according to claim 12 wherein the electrically conducting cups are adapted to reduce an incidence of plasma formation in the gas feed-through.

14. A chamber according to claim 12 wherein the electrically conducting cups comprise a cylindrical portion.

15. A chamber according to claim 12 wherein the dielectric insert comprises a porous ceramic, and optionally, one or more sleeves of a substantially dense ceramic or polymer.

16. A chamber according to claim 15 wherein the passage is formed through interconnected pores of the porous ceramic.

17. A chamber according to claim 12 wherein the electrically conducting cups are shaped to reduce plasma formation in the gas feed-through.

18. A chamber according to claim 14 wherein the cylindrical portion comprises an aspect ratio of width to height that is sufficiently low to reduce an incidence of plasma formation in the gas feed-through.

19. A chamber according to claim 12 wherein one of the electrically conducting cups comprises a first end and the other electrically conducting cup comprises a second end, and the dielectric insert is adapted to be a stop between the first and second ends.

* * * * *